US012580010B2

(12) United States Patent
Alam

(10) Patent No.: US 12,580,010 B2
(45) Date of Patent: *Mar. 17, 2026

(54) SYSTEMS AND METHODS FOR DUAL STANDBY MODES IN MEMORY

(71) Applicant: Everspin Technologies, Inc., Chandler, AZ (US)

(72) Inventor: Syed M. Alam, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 123 days.

This patent is subject to a terminal disclaimer.

(21) Appl. No.: 18/668,795

(22) Filed: May 20, 2024

(65) Prior Publication Data

US 2024/0304228 A1    Sep. 12, 2024

Related U.S. Application Data

(63) Continuation of application No. 18/189,590, filed on Mar. 24, 2023, now Pat. No. 12,020,769, which is a continuation of application No. 17/455,292, filed on Nov. 17, 2021, now Pat. No. 11,651,802.

(51) Int. Cl.
*G11C 7/10* (2006.01)
*G11C 5/14* (2006.01)

(52) U.S. Cl.
CPC ............ *G11C 7/1069* (2013.01); *G11C 5/146* (2013.01); *G11C 5/148* (2013.01); *G11C 7/1045* (2013.01); *G11C 7/1096* (2013.01); *G11C 2207/2227* (2013.01)

(58) Field of Classification Search
CPC ..... G11C 7/1069; G11C 5/146; G11C 7/1045; G11C 7/1096; G11C 29/021; G11C 29/028; G11C 29/16; G11C 2029/4402; G11C 5/148; G11C 7/22; G11C 7/20; G11C 11/1673; G11C 11/1675; G11C 11/1693; G11C 11/1697
See application file for complete search history.

(56) References Cited

U.S. PATENT DOCUMENTS

| | | | |
|---|---|---|---|
| 9,202,572 | B2 | 12/2015 | Bronner et al. |
| 11,651,802 | B1 | 5/2023 | Alam |
| 12,020,769 | B2 | 6/2024 | Alam |
| 2007/0047365 | A1 | 3/2007 | Yoshinaga et al. |
| 2013/0028031 | A1 | 1/2013 | Kowalczyk |
| 2016/0021660 | A1 | 1/2016 | Krishnamurthy |

(Continued)

*Primary Examiner* — Jay W. Radke
(74) *Attorney, Agent, or Firm* — Bookoff McAndrews, PLLC

(57) ABSTRACT

1. The present disclosure is drawn to, among other things, a method for accessing memory using dual standby modes, the method including receiving a first standby mode indication selecting a first standby mode from a first standby mode or a second standby mode, configuring a read bias system to provide a read bias voltage and a write bias system to provide approximately no voltage, or any voltage outside the necessary range for write operation, based on the first standby mode, receiving a second standby mode indication selecting the second standby mode, and configuring the read bias system to provide at least the read bias voltage and the write bias system to provide a write bias voltage based on the second standby mode, the read bias voltage being lower than the write bias voltage.

20 Claims, 7 Drawing Sheets

(56)　　　　　　　　References Cited

U.S. PATENT DOCUMENTS

| 2017/0236561 | A1 | 8/2017 | Pedersen et al. | |
|---|---|---|---|---|
| 2018/0246662 | A1* | 8/2018 | Kim ..................... | G06F 3/0679 |
| 2020/0097062 | A1 | 3/2020 | Bazarsky et al. | |
| 2020/0202924 | A1 | 6/2020 | Intrater et al. | |
| 2020/0401207 | A1 | 12/2020 | Yang et al. | |
| 2021/0064119 | A1 | 3/2021 | Mirichigni et al. | |

* cited by examiner

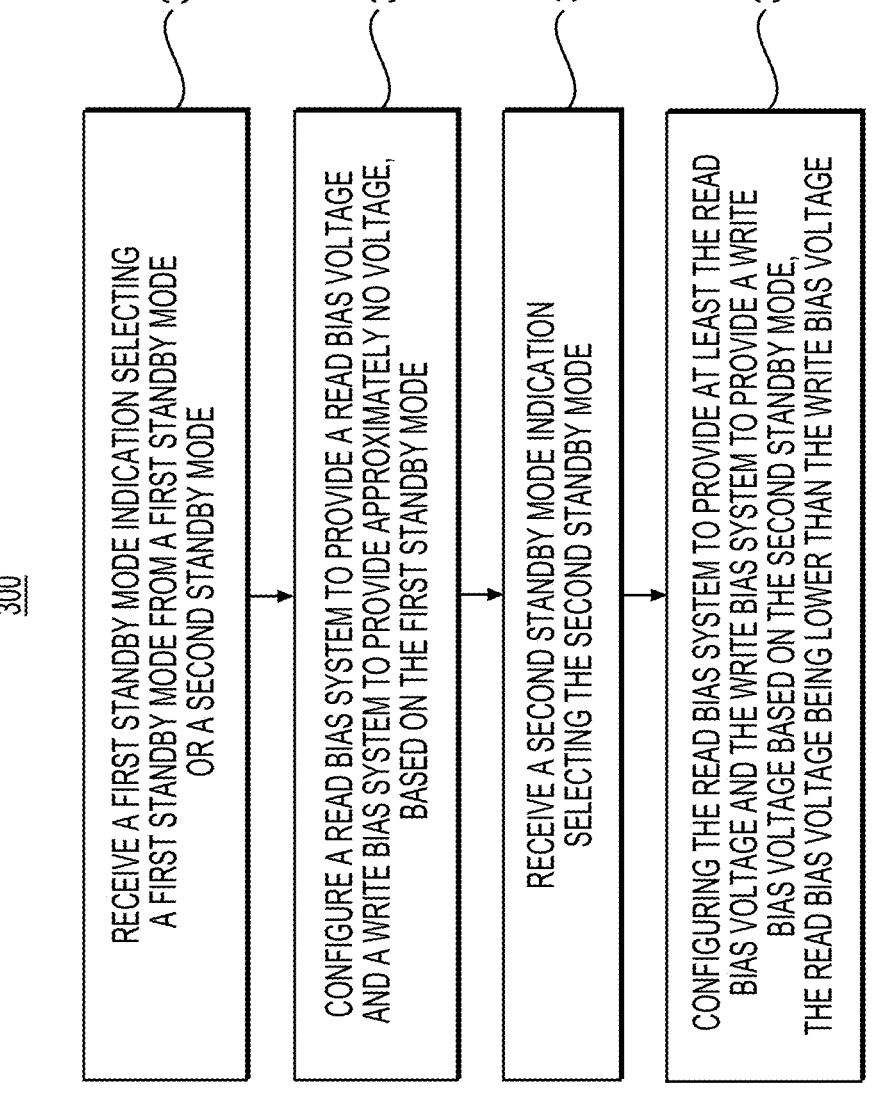

300

302
RECEIVE A FIRST STANDBY MODE INDICATION SELECTING A FIRST STANDBY MODE FROM A FIRST STANDBY MODE OR A SECOND STANDBY MODE

304
CONFIGURE A READ BIAS SYSTEM TO PROVIDE A READ BIAS VOLTAGE AND A WRITE BIAS SYSTEM TO PROVIDE APPROXIMATELY NO VOLTAGE, BASED ON THE FIRST STANDBY MODE

306
RECEIVE A SECOND STANDBY MODE INDICATION SELECTING THE SECOND STANDBY MODE

308
CONFIGURING THE READ BIAS SYSTEM TO PROVIDE AT LEAST THE READ BIAS VOLTAGE AND THE WRITE BIAS SYSTEM TO PROVIDE A WRITE BIAS VOLTAGE BASED ON THE SECOND STANDBY MODE, THE READ BIAS VOLTAGE BEING LOWER THAN THE WRITE BIAS VOLTAGE

502 — RECEIVE HISTORICAL APPLICATION DATA

504 — TRAIN A MACHINE LEARNING MODEL

506 — OUTPUT STANDBY MODE

508 — SET CONFIGURATION BIT BASED ON THE OUTPUT

510 — CONFIGURE READ BIAS SYSTEM AND WRITE BIAS SYSTEM BASED ON THE CONFIGURATION BIT

SYSTEMS AND METHODS FOR DUAL STANDBY MODES IN MEMORY

CROSS-REFERENCE TO RELATED APPLICATION(S)

This patent application is a continuation of and claims the benefit of priority to U.S. application Ser. No. 18/189,590, filed on Mar. 24, 2023, which is a continuation of and claims the benefit of priority to U.S. application Ser. No. 17/455, 292, filed on Nov. 17, 2021, now U.S. Pat. No. 11,651,802, the entireties of which are incorporated herein by reference.

TECHNICAL FIELD

Embodiments of the present disclosure relate to, among other things, systems and methods for operating a memory device in multiple standby modes, including a read standby mode and a write standby mode.

INTRODUCTION

In general, a memory system may include a memory device for storing data and a host (or controller) for controlling operations of the memory device. Memory devices may be classified into volatile memory (such as, e.g., dynamic random-access memory (DRAM), static random-access memory (SRAM), etc.) and non-volatile memory (such as, e.g., electrically erasable programmable read-only memory (EEPROM), ferroelectric random-access memory (FRAM), phase-change memory (PRAM), magnetoresistive memory (MRAM), resistive random-access memory (RRAM/ReRAM), flash memory, etc.).

Spin-torque magnetic memory devices store information by controlling the resistance across a magnetic tunnel junction (MTJ) such that a read current through the MTJ results in a voltage drop having a magnitude that is based on the state of the magnetoresistive stack. The resistance in each MTJ can be varied based on the relative magnetic states of the magnetoresistive layers within the magnetoresistive stack. In such memory devices, there is typically a portion of the magnetoresistive stack that has a fixed magnetic state and another portion that has a free magnetic state that is controlled to be either of two possible states relative to the portion having the fixed magnetic state. Because the resistance through the MTJ changes based on the orientation of the free portion relative to the fixed portion, information can be stored by setting the orientation of the free portion. The information is later retrieved by sensing the orientation of the free portion.

BRIEF DESCRIPTION OF THE DRAWINGS

In the course of the detailed description that follows, reference will be made to the appended drawings. The drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

Moreover, there are many embodiments of the present disclosure described and illustrated herein. The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein; however, all permutations and combinations are considered to fall within the scope of the present inventions.

FIG. 3 depicts a flowchart for an exemplary method of operating a memory device, according to an aspect of the present disclosure.

Figure 1:
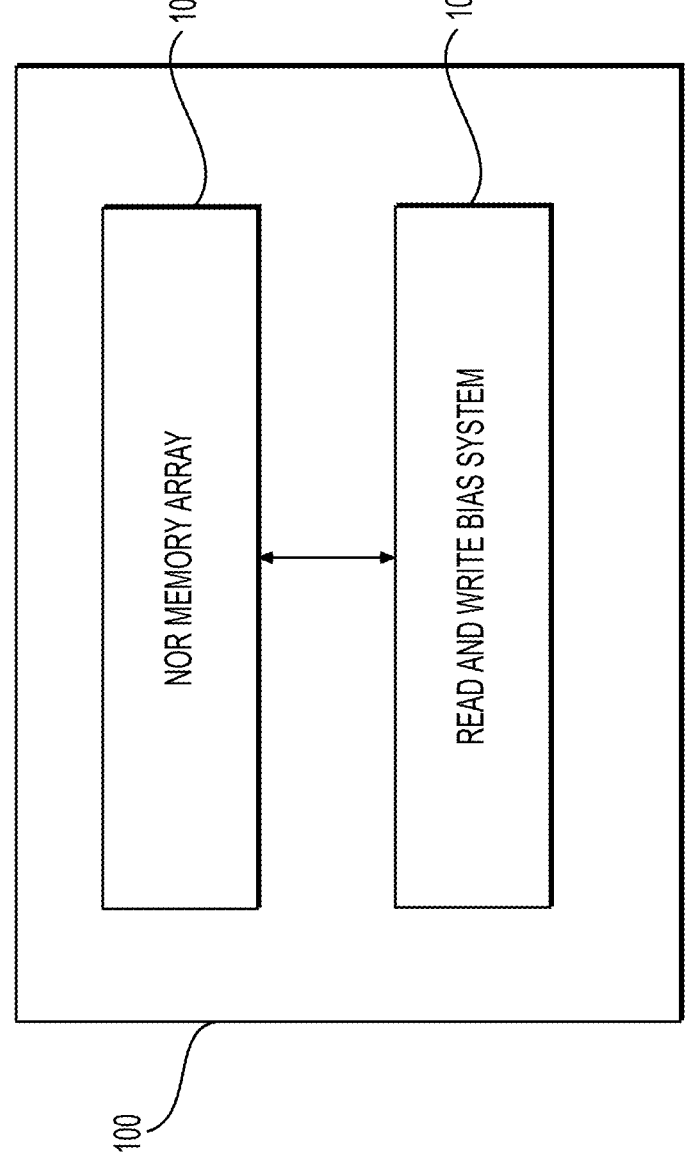
FIG. 1 depicts an example NOR memory device.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

Detailed illustrative aspects are disclosed herein. However, specific structural and functional details disclosed herein are merely representative for purposes of describing example embodiments of the present disclosure. The present disclosure may be embodied in many alternate forms and should not be construed as limited to only the embodiments set forth herein. Further, the terminology used herein is for the purpose of describing particular embodiments only and is not intended to be limiting of exemplary embodiments described herein.

When the specification makes reference to "one embodiment" or to "an embodiment," it is intended to mean that a particular feature, structure, characteristic, or function described in connection with the embodiment being discussed is included in at least one contemplated embodiment of the present disclosure. Thus, the appearance of the phrases, "in one embodiment" or "in an embodiment," in different places in the specification does not constitute a plurality of references to a single embodiment of the present disclosure.

As used herein, the singular forms "a," "an," and "the" are intended to include the plural forms as well, unless the context clearly indicates otherwise. It also should be noted that in some alternative implementations, the features and/or steps described may occur out of the order depicted in the figures or discussed herein. For example, two steps or figures shown in succession may instead be executed substantially concurrently or may sometimes be executed in the reverse order, depending upon the functionality/acts involved. In some aspects, one or more described features or steps may be omitted altogether, or may be performed with an intermediate step therebetween, without departing from the scope of the embodiments described herein, depending upon the functionality/acts involved.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described.

Serial Peripheral Interface (SPI) NOR based products can be implemented using a standby mode. During a standby mode, such SPI NOR products may receive a read or write program command. The SPI NOR products may be ready with bias voltages in a memory array such that a read or write command can be serviced without extra time being expended to reach the read and write bias voltages needed for NOR memory array read and/or write operations. In such SPI NOR products, wakeup time of read and write bias voltages are 100s of micro seconds, depending on memory density. The wakeup time may be accounted for in the power up time needed while powering up a memory product using an external power supply. The wakeup time may be accounted for in deep power down mode exit time. The read and write bias system of such SPI NOR products consume a read and write bias current to generate the voltages needed for memory array read and the write operations. Read and write bias currents may be consumed when an SPI NOR product is in standby mode.

FIG. 1 depicts an example NOR memory device 100. NOR memory device 100 in FIG. 1 includes a joint read and write bias system 101. Read and write bias system 101 may draw standby current to provide read and write bias voltages to the NOR memory array 102 during standby operation. The standby voltage may be sufficient to facilitate both read and write operations. For example, the standby voltage may be sufficient to facilitate a read operation by NOR memory array 102. The standby voltage may enable NOR memory array 102 to receive a read command, draw an active operation current, and perform the read operation. Similarly, the same standby voltage may enable NOR memory array 102 to receive a write command, draw an active operation current, and perform the write operation. Accordingly, read and write bias system 101 may draw a standby current large enough to provide read and write bias voltages for supporting both read and write operations. Standby current draw in bias system 101 is an issue for NOR memory device 100 application in low power systems.

Implementations of the disclosed subject matter reduce standby voltage generation in memory products using multiple standby modes. For example, implementations of the disclosed subject matter address standby voltage reduction in SPI NOR-like products (e.g., memory products that operate, at least in part, in a manner similar to SPI NOR products). The SPI NOR-like products may be a spin-transfer torque magnetoresistive memory (STT-MRAM) products or any other memory products that can be configured to include multiple standby modes using multiple bias systems (e.g., a read bias system and a write bias system).

In one aspect, the present disclosure is directed to techniques and implementations to lower standby current draw associated with bias voltage generation via multiple standby modes such as a fast read standby mode and a read plus write standby mode. Though the description below makes reference to MRAM devices, the inventions may be implemented in other memory devices including, but not limited to, EEPROM, FRAM, PRAM, RRAM/ReRAM and/or flash memory.

MRAM devices and other memory devices often include an array of memory cells divided into a plurality of banks or subarrays. In such memory devices, each bank can be accessed separately such that accesses between banks can be interleaved to optimize data throughput. Some magnetic memory devices support dual data rate (DDR) memory protocols.

Figure 2:
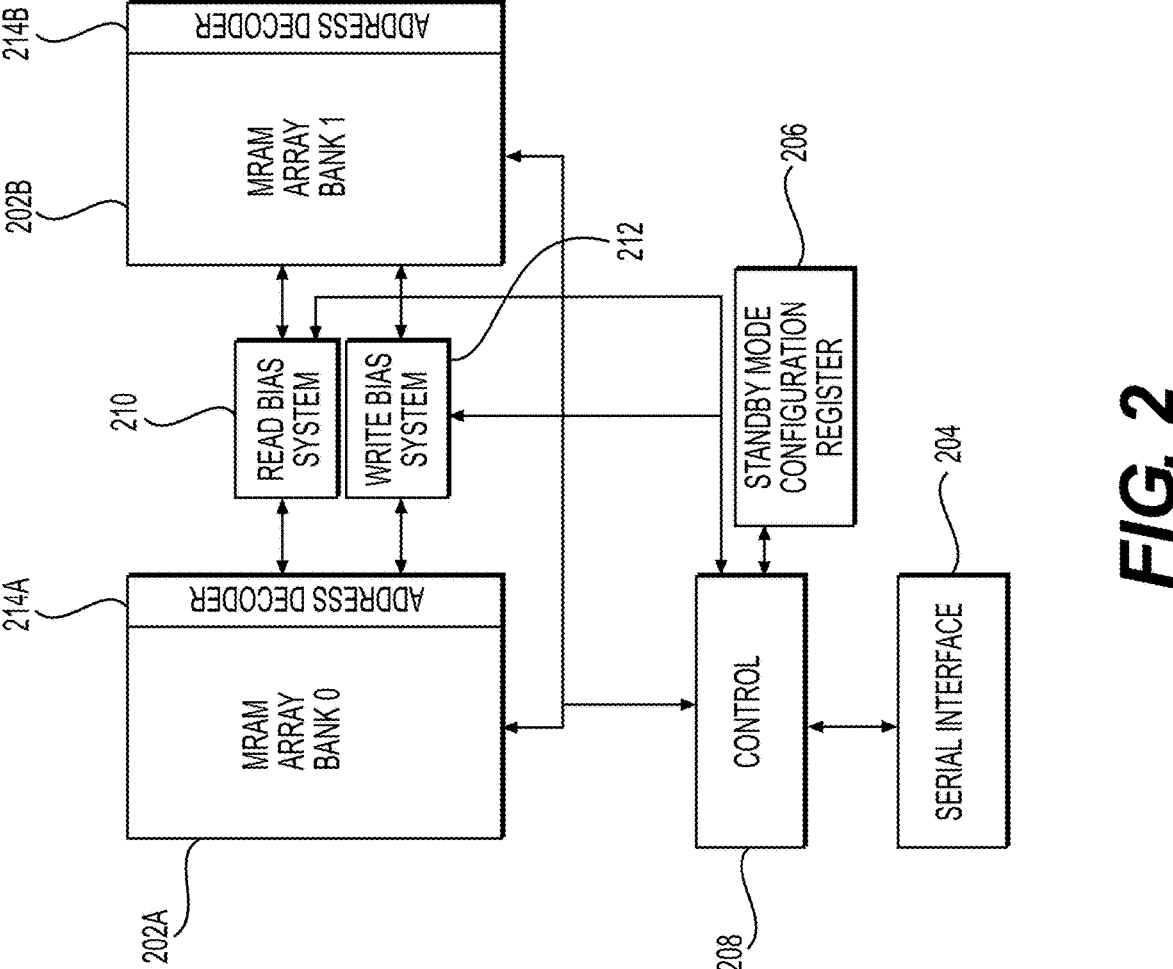
FIG. 2 depicts a block diagram of an exemplary memory device, according to an aspect of the present disclosure.

FIG. 2 depicts a block diagram of an exemplary memory system 200 (e.g., MRAM device), in accordance with the subject matter disclosed herein. Memory system 200 includes a first MRAM array 202A and a second MRAM array 202B (e.g., array banks). Although two array banks are shown in FIG. 2, it will be understood that the techniques disclosed herein may be implemented using any number of array banks (i.e., one or more array banks). MRAM array 202A may have an address decoder 214A and MRAM array 202B may have an address decoder 214B. Address decoders 214A and 214B may be configured to decode a read or write request to identify a memory location that corresponds to the read or write request (e.g., an address). MRAM arrays 202A and 202B may be biased with a read bias voltage, write bias voltage, active voltage, or no voltage. MRAM arrays 202A and/or 202B biased with no voltage may be in an off state such that any read or write requests may not be fulfilled. MRAM arrays 202A and/or 202B biased with a read bias voltage may draw an active read voltage upon receipt of a read command. MRAM arrays 202A and/or 202B biased with a write bias voltage may require write bias system 212 to draw a write bias voltage and may further draw an active write voltage upon receipt of a write command.

Read bias system 210 may be connected to MRAM array 202A and 202B. Read bias system 210 may be configured to provide a read standby bias voltage to MRAM array 202A and 202B during standby operation. Read bias system 210 may generate a voltage equal to or less than a supply voltage (e.g., 1.8 V) for operation during a standby mode. Read bias system 210 may receive a control signal from control 208. Based on control 208, read bias system 210 may be configured to enter a standby mode and may draw a corresponding current from the supply voltage (e.g., 1.8 V) during standby mode operation. For example, read bias system 210 may be configured to generate between 1.5V and 1.8V during standby mode. Read bias voltage level (e.g., between 1.5V and 1.8V) generated by the read bias system 210 is necessary for read operation in MRAM Array 202A and 202B when a read operation command is received by memory system 200.

Write bias system 212 may be connected to MRAM array 202A and 202B. Write bias system 212 may be configured to provide a write standby voltage to MRAM array 202A and 202B during standby operation. Write bias system 212 may generate a voltage greater than a supply voltage (e.g., a write bias voltage of 2.0 V) for operation during a write standby mode. For example, write bias system 212 may generate a write bias voltage of 2.0V that is greater than a supply voltage of 1.8V, during a write bias mode. Write bias system 212 may receive a control signal from control 208. Based on control 208, write bias system 212 may be configured to enter a write standby mode and may draw a corresponding current during the write standby mode operation. For example, write bias system 212 may be configured to generate between 2.0V and 2.8V. Write bias voltage level (e.g., between 2.0V and 2.8V) generated by write bias system 210 may be necessary for write operation in MRAM Array 202A and 202B when a write operation command is received by memory system 200.

Read bias system 210 may provide MRAM arrays 202A and/or 202B a read bias voltage during either a read standby mode or a write standby mode. Write bias system 212 may provide MRAM arrays 202A and/or 202B a write bias voltage during a write standby mode and may not generate the necessary write bias voltage level during a read standby mode. Accordingly, control 208 may transmit a signal for operation under a read standby mode and read bias system 210 may receive the transmitted signal. Read bias system 210 may generate a read bias voltage (e.g., less than or equal to a supply voltage). The read bias voltage may be used by MRAM arrays 202A and/or 202B to transition into an active read mode upon receiving a read command from control 208.

Control 208 may transmit a signal for operation under a write standby mode and read bias system 210 and write bias system 212 may receive the transmitted signal. Read bias system 210 may generate a read bias voltage (e.g., less than or equal to a supply voltage) and write bias system 212 may generate a write bias voltage (e.g., greater than a supply voltage). The read bias voltage and/or write bias voltage may be used by MRAM arrays 202A and/or 202B to transition into an active respective read or write modes upon receiving a corresponding command from control 208.

Read bias system 210 may be physically distinct from the write bias system 212 such that the components (e.g., circuitry) of the read bias system 210 may be different than the components of the write bias system 212. Read bias system 210 may be smaller than write bias system 212. Read bias system 210 may include a read wordline, a read column selection, a read bitline voltage, etc., each of which may be physically distinct from write bias system 212's write wordline, write column selection, write bitline voltage, etc. For example, a write operation may require higher bias voltages than a supply voltage. Down (e.g., write 0) and up (e.g., write 1) may require precise temperature-controlled voltages from a charge pump or may be regulated down from a pumped voltage. Accordingly, write bias circuitry may be more complex than read bias circuitry. Read and write bias voltages provided by read bias system 210 and write bias system 212, respectively, may be voltages that are applied to read and write NMOS transistor follower circuitry for read and write drivers in MRAM arrays 202A and/or 202B.

Control 208 may receive command signals from a component such as a serial interface 204. Serial interface 204 may also configure a standby mode configuration register 206. Serial interface 204 may configure standby mode configuration register 206 directly or via control 208. Standby mode configuration register 206 may store a current standby mode for memory system 200 at any given time.

Standby mode configuration register 206 may store a current standby mode via any applicable manner such as a standby mode configuration bit. For example, a standby mode configuration bit having a binary true (i.e., "1") value may correspond to either a read standby mode or a write standby mode and standby mode configuration bit having a binary false (i.e., "0") value may correspond to the other of the read standby mode or write standby mode. Standby mode configuration bit may be a nonvolatile configuration register bit that may be set and/or reset by control 208. Control 208 may have access to the given configuration (i.e., read standby mode or write standby mode) based on the standby mode configuration register 206, and may detect a change in the configuration bit.

Accordingly, the memory system 200 may be configured with a read bias system 210 and a write bias system 212 that allow for a relatively faster operation during a read bias mode using up to an available supply voltage. During a read bias mode (e.g., as determined based on a standby mode configuration bit), the circuitry of the write bias system 212 may be deactivated. During the read bias mode, read commands may be processed and MRAM array 202A and/or 202B (e.g., STT-MRAM arrays) may be accessed for a read operation without a substantial bias wake time (e.g., less than 100 microseconds). During the read bias mode, a received write command may require powering up write bias system 212 before accessing MRAM array 202A and/or 202B for the write operation. Accordingly, the wake up time may be added to the total write operation if a write command is received during a read bias mode. The amount of time for activation of MRAM array 202A and/or 202B may be determined based on whether memory system 200 is in a read standby mode or a write standby mode (i.e., the configuration of read bias system 210 and write bias system 212) and whether the activation is based on a write command or a read command.

Serial interface 204 may be configured to provide a signal indicating a write standby mode or a read standby mode based on a given application that MRAM array 202A and/or 202B is used for. For example, during a code storage application, code may be written to MRAM array 202A and/or 202B one time and may be read repeatedly. Based on the MRAM array 202A and/or 202B being used for a code storage application, standby mode configuration register 206 may be updated to reflect a read standby mode to allow for fast read operations than is the case with conventional, joint read and write bias systems 101. Write bias system 212 is disabled in a read standby mode resulting in lower standby current draw by memory system 200.

As another example, during a data storage application, data may be written and re-written to MRAM array 202A and/or 202B. Previous data may be updated based on, for example, calculations, operations, updates, or the like. Based the MRAM array 202A and/or 202B being used for a data storage application, standby mode configuration register 206 may be updated to reflect a write standby mode. Read bias system 210 and write bias system 212 may both be enabled during write standby mode. In an alternate embodiment, only the write bias system 212 may be enabled in a write standby mode.

A machine learning model may be used to configure standby mode configuration register 206, as further disclosed herein. The machine learning model may output one of the read standby mode or write standby mode based on one or more of an application, historical use, or the like.

FIG. 3 depicts a flowchart for an exemplary method 300 of operating a memory device (e.g., an MRAM device).

Method 300 may be performed by memory system 200 illustrated in FIG. 2. At 302, a first standby mode indication may be received for selecting a first standby mode from a first standby mode or a second standby mode. The first standby mode indication may be either a read standby mode or a write standby more. The first standby mode indication may be received at read bias system 210 and write bias system 212 of FIG. 2. The first standby mode indication may be provided by control 208 based on a bit configuration at standby mode configuration register 206. The bit configuration may be determined based on an input from serial interface 204 and/or a machine learning model.

At 304, read bias system 210 may be configured with a read bias voltage and write bias system 212 may be disabled, configured to provide approximately no voltage or voltage outside (e.g., below) the range for write operations, based on the first standby mode at 302 corresponding to a read bias mode. The read bias voltage may be less than or equal to a supply voltage (e.g., approximately 1.5 V-1.8 V). Read bias system 210 may require less voltage than the supply voltage to maintain a read standby state at least in part due to less complex circuitry associated with read bias system 210. Accordingly, memory system 200 may operate in a fast read standby mode by utilizing a low voltage (e.g., a supply voltage or less) without a substantial read bias wake time. Memory system 200 may have less current draw in a read standby mode as the write bias system 212 is disabled.

At 306, a second standby mode indication may be received for selecting a second standby mode from a first standby mode or a second standby mode. The second standby mode indication may correspond to a write standby mode. The second standby mode indication may be received at read bias system 210 and write bias system 212 of FIG. 2. The second standby mode indication may be provided by control 208 based on a bit configuration at standby mode configuration register 206. The bit configuration may be determined based on an input from serial interface 204 and/or a machine learning model.

At 308, read bias system 210 may be configured with a read bias voltage and write bias system 212 may be configured with a write bias voltage, based on the second standby mode at 306 corresponding to a write bias mode. The read bias voltage may be less than or equal to a supply voltage (e.g., approximately 1.5 V-1.8 V) and the write bias voltage may be greater than the supply voltage. Memory system 200 may operate in a write standby mode by utilizing a low voltage (e.g., a supply voltage or less) for the read bias system 210 and a higher voltage for the write bias system 212. Accordingly, read operations in a read standby mode may require less overall voltage (i.e., only the voltage required by read bias system 210) than read operations in write standby mode (i.e., the voltage required by read bias system 210 and write bias system 212).

Figures 4A, 4B:
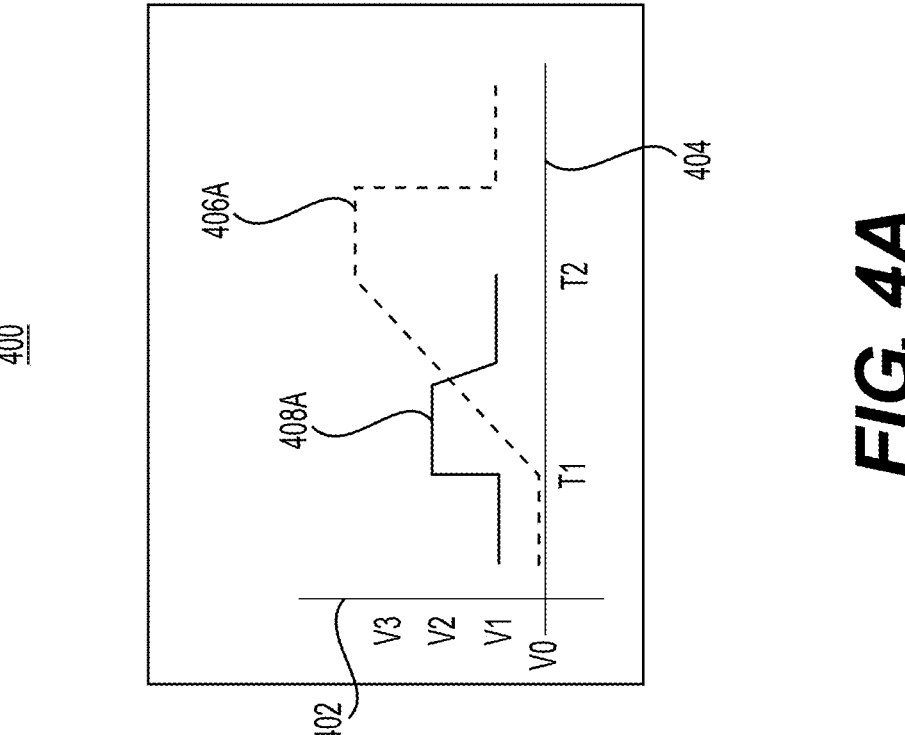
FIG. 4A depicts a chart of a memory system under a read bias mode, according to an aspect of the present disclosure.
FIG. 4B depicts a chart of a memory system under a write bias mode, according to an aspect of the present disclosure.

FIG. 4A shows an example chart 400 showing a read standby mode operation having time as its X-axis 404 and voltage as its Y-axis 402. During the read standby mode, a read operation 408A and a write operation 406A may be implemented. Read standby voltage generated by read bias system 210 may be V1 and may be equal to or less than a supply voltage. The standby voltage drawn by a memory system during the read standby mode may equal the read standby voltage V1. During the read standby mode, a read operation command may be received at T1. Based on the read operation command, one or more memory arrays may transition to an active mode and may draw an active read voltage V2. As shown, the transition from the standby read voltage V1 to active read voltage V2 may be nearly immediate. In the preferred embodiment, standby read voltage V1 is the same as or very close to active read voltage V2 such that there is no transition delay. Accordingly, during read standby mode, by using read bias system 210 separate from write bias system 212, the voltage draw of a memory system may be V1 and read operations may be implemented without a substantial bias wake time.

During the read standby mode, write operation 406A may include a write standby voltage of V0 (e.g., approximately no voltage or any voltage outside the range necessary for write operation) provided by write bias system 212. During the read standby mode, a write operation command may be received at T1. Based on the write operation command, one or more memory arrays may transition to an active mode and may draw an active write voltage V3. The active write voltage may be reached at T2. As shown, the transition from the standby write voltage V0 to active write voltage V3 may require a time duration equal to T2-T1, which may be substantially greater than the nearly immediate transition of the voltage from the read standby voltage V1 to the active read voltage V2 during the read standby mode. Accordingly, during read standby mode, by using read bias system 210 separate from write bias system 212, the voltage draw of a memory system may be V1 and write operations may be implemented with a substantial bias wake time.

FIG. 4B shows an example chart 420 showing a write standby mode operation having time as its X-axis 404 and voltage as its Y-axis 402. During the write standby mode, a read operation 408B and a write operation 406B may be implemented. Read standby voltage may be V1 and may be equal to or less than a supply voltage. The standby voltages drawn by a memory system during the write standby mode may equal the read standby voltage V1 along with a write standby voltage V3 that is greater than read standby voltage V1. During the write standby mode, a read operation command may be received at T1. Based on the read operation command, one or more memory arrays may transition to an active mode and may draw an active read voltage V2. As shown, the transition from the standby read voltage V1 to active read voltage V2 may be nearly immediate. In the preferred embodiment, standby read voltage V1 is approximately the same as the active read voltage V2 such that there is no transition delay.

During the write standby mode, write operation 406B may include a write standby voltage of V3 provided by write bias system 212. During the write standby mode, a write operation command may be received at T1. Based on the write operation command, one or more memory arrays may transition to an active mode and may draw an active write voltage V4. As shown, the transition from the standby write voltage V3 to active write voltage V4 may be nearly immediate. In the preferred embodiment, standby write voltage V3 is approximately the same as the active write voltage V4 such that there is no transition delay.

Accordingly, during a write standby mode, a memory system may draw more voltages than during a read standby mode. Further, during the write standby mode, a memory array may transition from a standby voltage to an active write voltage faster than the memory array transitions from a standby to an active write voltage during a read standby mode.

Figure 5:
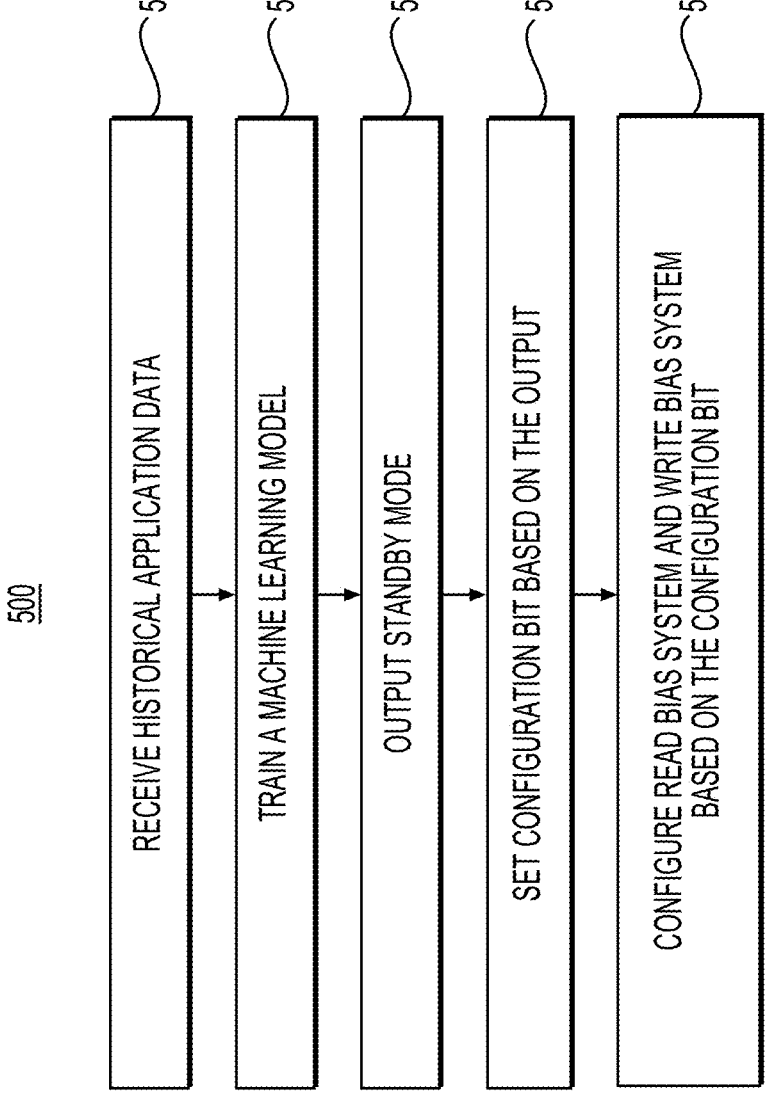
FIG. 5 depicts a flowchart for using machine learning to output an operation mode, according to an aspect of the present disclosure.

FIG. 5 depicts a flowchart 500 for using machine learning to determine and output an operation mode. At 502, historical application data may be received. The historical application data may correspond to the types of applications that memory system 200 is used to implement. The historical application data may include the types of applications that have historically been used by memory system 200. More specifically, historical application data may identify write operations versus read operations implemented historically by applications using memory system 200. It will be understood that though the historical application is disclosed herein for memory system 200, the historical application data may correspond to any memory system that can be used to predict the use of a given memory system 200.

According to an implementation, historical application data may include read and/or write operation data for a given application. For example, memory system 200 may be slotted for use for a given application (e.g., a code storage application, data storage application, etc.). Accordingly, the historical application data may include data regarding the number, types, sequence, frequency, or the like of read and/or write operations historically implemented by the given application for one or more memory systems.

A machine learning model may be trained based on the historical application data (e.g., using supervised or semi-supervised learning). According to implementations, the machine learning model may be trained or additionally trained based on unsupervised learning. For example, the machine learning model may receive the historical application data, one or more applications to be implemented using a memory system, and the like. At 504, the machine learning model may be trained using the historical application data or one or more other techniques further disclosed herein.

At 506, the machine learning model may output a standby mode (e.g., a read standby mode or a write standby mode), based on one or more inputs including an application, application type, task, user, software, etc. The output may be provided to control 208 and/or standby mode configuration register 206. The output may be based on the likelihood of a number of read operations or write operations to be performed by a memory system, the frequency of read or write operations, the timing of read or write operations, or the like. The output may be updated over time based on updated inputs (e.g., updated application, application status, application type, task, user, software, etc.).

At 508, a configuration bit at the standby mode configuration register 206 may be set based on the output (e.g., set to 0 or 1 based on a read standby mode output or a write standby mode output). The configuration bit may be set, for example, based on a signal received from control 208. At 510, read bias system 210 and/or write bias system 212 may be configured based on the configuration bit set at 508.

Figure 6:
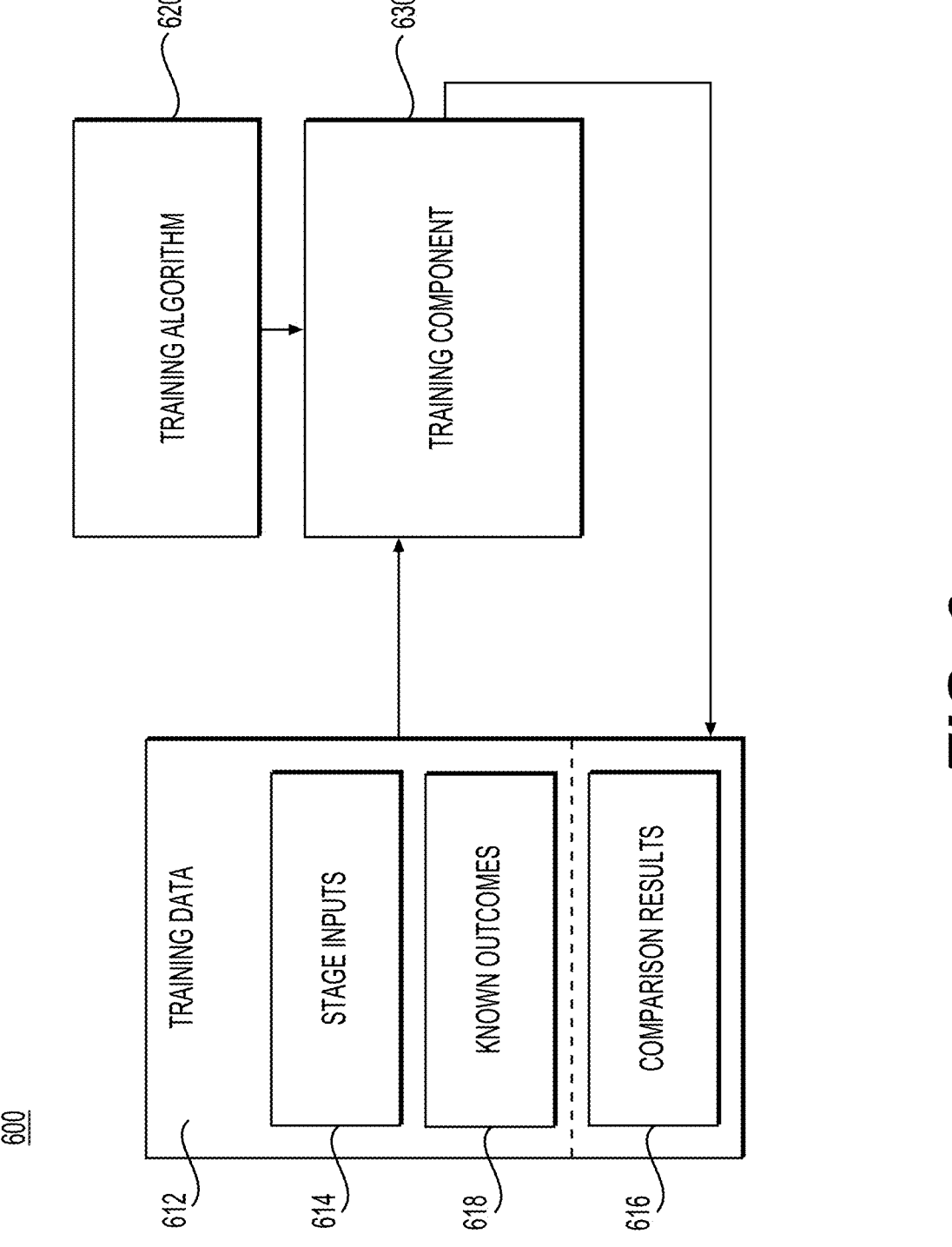
FIG. 6 depicts a block diagram of yet another exemplary MRAM device, according to an aspect of the present disclosure.

The machine learning model disclosed herein may be trained using the data flow 600 of FIG. 6. As shown in FIG. 6, training data 612 may include one or more of stage inputs 614 and known outcomes 618 related to a machine learning model to be trained. The stage inputs 614 may be from any applicable source including a controller, a processor, a software, a step from method 300 of FIG. 3, or the like or a combination thereof. The known outcomes 618 may be included for machine learning models generated based on supervised or semi-supervised training. For example, known outcomes 618 may be based on historical application data. An unsupervised machine learning model may not be trained using known outcomes 618. Known outcomes 618 may include known or desired outputs for future inputs similar to or in the same category as stage inputs 614 that do not have corresponding known outputs.

The training data 612 and a training algorithm 620 may be provided to a training component 630 that may apply the training data 612 to the training algorithm 620 to generate a machine learning model. The machine learning model may be generated by adjusting one or more weights or one or more layers of an untrained model. According to an implementation, the training component 630 may be provided comparison results 616 that compare a previous output of the corresponding machine learning model to apply the previous result to re-train the machine learning model. The comparison results 616 may be used by the training component 630 to update the corresponding machine learning model. The training algorithm 620 may utilize machine learning networks and/or models including, but not limited to a deep learning network such as Deep Neural Networks (DNN), Convolutional Neural Networks (CNN), Fully Convolutional Networks (FCN) and Recurrent Neural Networks (RCN), probabilistic models such as Bayesian Networks and Graphical Models, and/or discriminative models such as Decision Forests and maximum margin methods, or the like.

Figure 7:
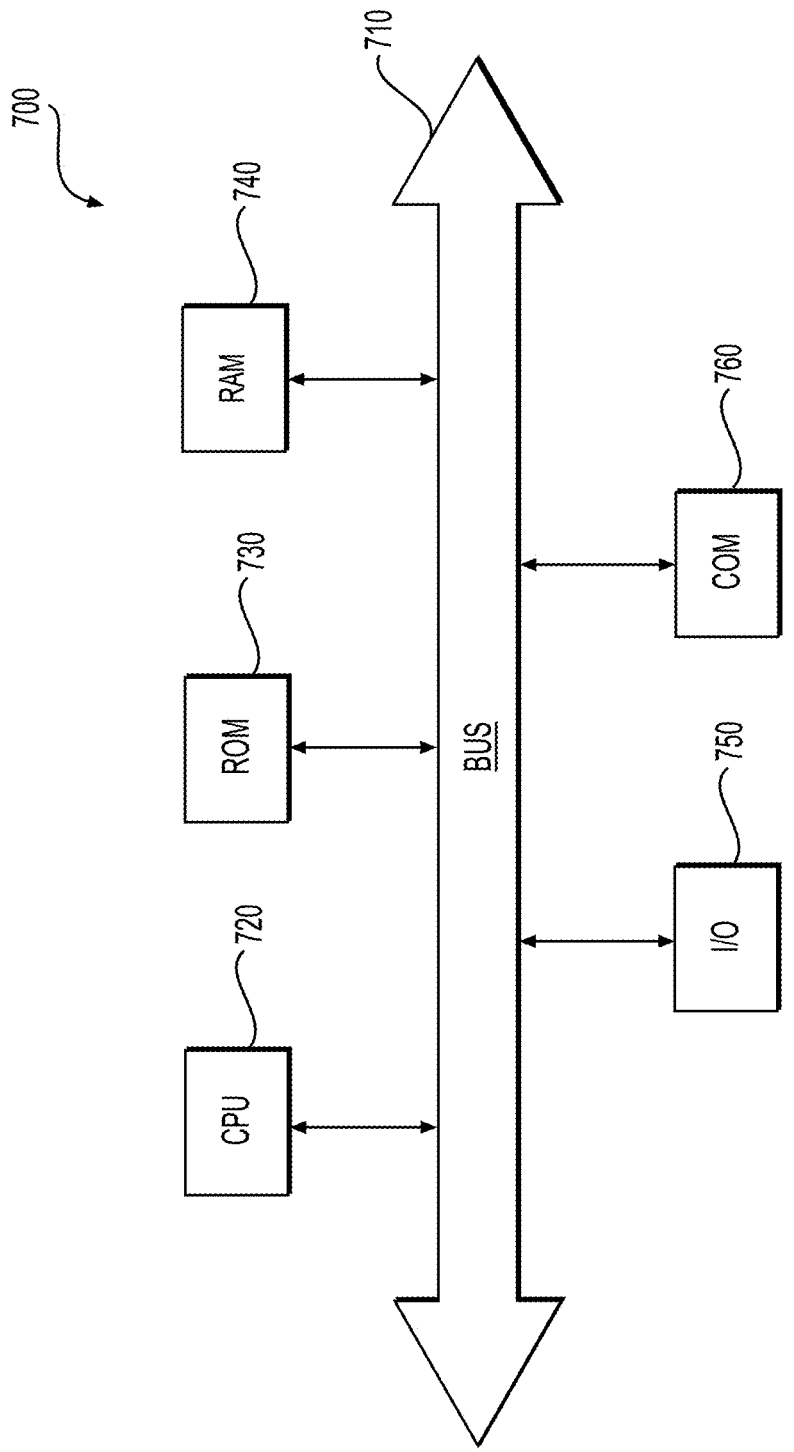
FIG. 7 depicts a block diagram of an exemplary computing device that may execute techniques described in the present disclosure.

FIG. 7 depicts an example system 700 that may execute techniques presented herein. FIG. 7 is a simplified functional block diagram of a computer that may be configured to execute techniques described herein, according to exemplary embodiments of the present disclosure. Specifically, the computer (or "platform" as it may not be a single physical computer infrastructure) may include a data communication interface 760 for packet data communication. The platform may also include a central processing unit ("CPU") 720, in the form of one or more processors, for executing program instructions. The platform may include an internal communication bus 710, and the platform may also include a program storage and/or a data storage for various data files to be processed and/or communicated by the platform such as ROM 730 and RAM 740, although the system 700 may receive programming and data via network communications. Any of ROM 730 or RAM 740 may comprise of MRAM devices or any other memory devices including but not limited to EEPROM, FRAM, PRAM, RRAM/ReRAM and/or flash memory. The system 700 also may include input and output ports 750 to connect with input and output devices such as keyboards, mice, touchscreens, monitors, displays, etc. Of course, the various system functions may be implemented in a distributed fashion on a number of similar platforms, to distribute the processing load. Alternatively, the systems may be implemented by appropriate programming of one computer hardware platform.

The particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

In one embodiment, a method for accessing memory using dual standby modes is disclosed. The method may comprise: receiving a first standby mode indication selecting a first standby mode from a first standby mode or a second standby mode; configuring a read bias system to provide a read bias voltage and a write bias system to provide approximately no voltage or any voltage below a voltage range for write operation, based on the first standby mode; receiving a second standby mode indication selecting the second standby mode; and configuring the read bias system to provide at least the read bias voltage and the write bias system to provide a write bias voltage based on the second standby mode, the read bias voltage being lower than the write bias voltage.

Various embodiments of the method may comprise, without limitation: receiving a read command or a write command and activating a memory bank based on the read command or the write command, an amount of time for activation of the memory bank being determined based on the read command or the write command and on the configuration of the read bias system and the write bias system; wherein an amount of time to activate a memory bank for a write operation is greater during the first standby mode than during the second standby mode; wherein each of the first standby mode indication and the second standby mode indication is based on a configuration bit at a standby mode configuration register; wherein the read bias voltage is approximately in the range of 1.5V to 1.8V; wherein the read bias voltage is less than or equal to a standby supply voltage; wherein the write bias voltage is approximately in the range of 2.0V to 2.8V; wherein the write bias voltage is greater than or equal to a standby supply voltage; wherein the first standby mode indication or the second standby mode indication is received based on historical controller commands; wherein the historical controller commands are input to a machine learning model that outputs the first standby mode indication or the second standby mode indication; and wherein the first standby mode indication or the second standby mode indication is received based on a voltage application.

In another embodiment, a system for accessing memory using dual standby modes is disclosed. The system may comprise: a memory array; a read bias system; a write bias system physically distinct from the read bias system; a standby mode configuration register; and a controller. The controller is configured to: provide a standby signal to the read bias system and the write bias system based on a configuration bit at the standby mode configuration register, the configuration bit indicating a first standby configuration from a first standby configuration or a second standby configuration, the read bias system configured to provide a read bias voltage based on the first standby configuration and the write bias system configured to provide approximately no voltage, or any voltage below a voltage range for write operation, based on the first standby configuration; provide a read command or a write command to the memory array; detect a change in the configuration bit to indicate a second standby configuration; and provide an updated standby signal to the read bias system and the write bias system based on the change in the configuration bit, the read bias system configured to provide a read bias voltage based on the second standby configuration and the write bias system configured to provide a write bias voltage based on the second standby configuration.

Various embodiments of the system may comprise, without limitation: wherein the read bias system provides a lower voltage for operation than the write bias system; wherein the read bias voltage is approximately in the range of 1.5V to 1.8V; wherein the read bias voltage is less than or equal to a standby supply voltage; wherein the write bias voltage is approximately in the range of 2.0V to 2.8V; wherein the write bias voltage is greater than or equal to a standby supply voltage; wherein the first standby mode indication or the second standby mode indication is received based on historical controller commands; and wherein the memory array is a magnetoresistive memory (MRAM) array.

In yet another embodiment, a non-transitory computer-readable medium storing instructions that, when executed by a processor, cause the processor to perform operations for accessing memory using dual standby modes is disclosed. The operations may comprise: receiving a first standby mode indication selecting a first standby mode from a first standby mode or a second standby mode; configuring a read bias system to provide a read bias voltage and a write bias system to provide approximately no voltage, or any voltage below a voltage range for write operation, based on the first standby mode; receiving a second standby mode indication selecting the second standby mode; and configuring the read bias system to provide at least the read bias voltage and the write bias system to provide a write bias voltage based on the second standby mode, the read bias voltage being lower than the write bias voltage.

The foregoing description of the inventions has been described for purposes of clarity and understanding. It is not intended to limit the inventions to the precise form disclosed. Various modifications may be possible within the scope and equivalence of the application.

I claim:

1. A method for configuring memory, the method comprising:
   configuring a bias system to provide a first bias voltage corresponding to a first standby mode;
   receiving a standby mode indication selecting a second standby mode;
   upon receiving the standby mode indication, configuring the bias system to provide a second bias voltage corresponding to the second standby mode, wherein the second bias voltage is different from the first bias voltage, and wherein the first and second bias voltages are provided based on receiving a read command and a write command.

2. The method of claim 1, further comprising:
   activating a memory bank based on the read command or the write command, an amount of time for activation of the memory bank being determined based on the read command or the write command and on the configuration of the bias system.

3. The method of claim 2, wherein the amount of time to activate the memory bank based on the write command is greater during the first standby mode than during the second standby mode.

4. The method of claim 1, wherein the method further comprises: upon receiving the standby mode indication, configuring the bias system to provide the first bias voltage along with the second bias voltage.

5. The method of claim 1, wherein the first standby mode is a read standby mode.

6. The method of claim 1, wherein the second standby mode is a write standby mode.

7. The method of claim 1, wherein the second bias voltage is greater than the first bias voltage.

8. The method of claim 1, wherein the standby mode indication is based on a configuration bit at a standby mode configuration register.

9. The method of claim 1, wherein the first bias voltage is approximately in a range of 1.5V to 1.8V.

10. The method of claim 1, wherein the first bias voltage is less than or equal to a standby supply voltage.

11. The method of claim 1, wherein the second bias voltage is approximately in a range of 2.0V to 2.8V.

12. The method of claim 1, wherein the standby mode indication is received based on historical controller commands.

13

14

13. The method of claim 1, wherein the standby mode indication is received based on historical controller commands, and wherein the historical controller commands are input to a machine learning model that outputs the standby mode indication.

14. The method of claim 1, wherein the standby mode indication is received based on a voltage application.

15. A system for configuring memory, the system comprising:

a memory;

a bias system; and a controller, wherein the controller is configured to:

configure the bias system to provide a first bias voltage corresponding to a first standby mode;

receive a standby mode indication selecting a second standby mode;

upon receiving the standby mode indication, configure the bias system to provide a second bias voltage corresponding to the second standby mode, wherein the second bias voltage is different from the first bias voltage, and wherein the first and second bias voltages are provided based on receiving a read command and a write command.

16. The system of claim 15, wherein the controller is further configured to:

receive the read command or the write command; and activate a memory bank based on the read command or the write command, an amount of time for activation of the memory bank being determined based on the read command or the write command and on a configuration of the bias system.

17. The system of claim 15, wherein the standby mode indication is received based on historical controller commands, and wherein the historical controller commands are input to a machine learning model that outputs the standby mode indication.

18. A non-transitory computer-readable medium storing instructions that, when executed by a processor, cause the processor to perform operations, the operations comprising:

configuring a bias system to provide a first bias voltage corresponding to a first standby mode;

receiving a standby mode indication selecting a second standby mode; and upon receiving the standby mode indication, configuring the bias system to provide a second bias voltage corresponding to the second standby mode, wherein the second bias voltage is different from the first bias voltage, and wherein the first and second bias voltages are provided based on receiving a read command and a write command.

19. The non-transitory computer-readable medium of claim 18, wherein the operations further comprise:

activating a memory bank based on the read command or the write command, an amount of time for activation of the memory bank being determined based on the read command or the write command and on a configuration of the bias system.

20. The non-transitory computer-readable medium of claim 18, wherein the standby mode indication is received based on historical controller commands, and wherein the historical controller commands are input to a machine learning model that outputs the standby mode indication.

* * * * *